(12) United States Patent
Hirota et al.

(10) Patent No.: US 10,879,448 B2
(45) Date of Patent: Dec. 29, 2020

(54) RESONATOR AND RESONATOR DEVICE

(71) Applicant: Murata Manufacturing Co., Ltd., Nagaokakyo (JP)

(72) Inventors: Wakana Hirota, Nagaokakyo (JP); Ville Kaajakari, Altadena, CA (US)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 164 days.

(21) Appl. No.: 15/926,347

(22) Filed: Mar. 20, 2018

(65) Prior Publication Data

US 2018/0212139 A1 Jul. 26, 2018

Related U.S. Application Data

(63) Continuation of application No. PCT/JP2016/073912, filed on Aug. 16, 2016.

(60) Provisional application No. 62/240,574, filed on Oct. 13, 2015.

(51) Int. Cl.
*H01L 41/053* (2006.01)
*H03H 9/02* (2006.01)
*H03H 9/05* (2006.01)
*H03H 9/10* (2006.01)
*H03H 9/24* (2006.01)
*H03H 9/21* (2006.01)
*G01L 1/10* (2006.01)
*H03B 5/32* (2006.01)

(52) U.S. Cl.
CPC ............ *H01L 41/053* (2013.01); *G01L 1/106* (2013.01); *H03B 5/32* (2013.01); *H03H 9/02433* (2013.01); *H03H 9/0595* (2013.01); *H03H 9/1057* (2013.01); *H03H 9/21* (2013.01); *H03H 9/2489* (2013.01)

(58) Field of Classification Search
CPC . H03B 5/32; G01L 1/106; H03H 9/21; H03H 9/0547; H03H 9/02433; H03H 9/0595; H03H 9/1057; H03H 9/2489; H01L 41/053
USPC ............... 331/158, 107 A, 154, 116 M, 156; 310/370, 368; 333/200
See application file for complete search history.

(56) References Cited

U.S. PATENT DOCUMENTS

2015/0188514 A1* 7/2015 Yamada ................. G01L 1/106
331/156
2016/0197597 A1 7/2016 Yamada et al.

FOREIGN PATENT DOCUMENTS

| JP | S5458395 A | 5/1979 |
| JP | S5685922 A | 7/1981 |
| JP | 2004208237 A | 7/2004 |

(Continued)

OTHER PUBLICATIONS

International Search Report issued in International Application No. PCT/JP2016/073912, dated Nov. 15, 2016.

(Continued)

*Primary Examiner* — Arnold M Kinkead
(74) *Attorney, Agent, or Firm* — Arent Fox LLP

(57) ABSTRACT

A resonator includes a vibrator with a base, and multiple vibrating arms extending therefrom. Moreover, a frame surrounds a periphery of the vibrating part and a holding arm couples the vibrator to the frame. The holding arm includes a pair of first support arms that are connected to the base opposite the vibrating arms and a coupling portion that couples the support arms with one another and that is connected to the frame.

21 Claims, 9 Drawing Sheets

(56) References Cited

FOREIGN PATENT DOCUMENTS

| | | |
|---|---|---|
| JP | 5071058 B2 | 11/2012 |
| WO | 2015041152 A1 | 3/2015 |

OTHER PUBLICATIONS

Written Opinion of the International Searching Authority issued in International Application No. PCT/JP2016/073912, dated Nov. 15, 2016.

\* cited by examiner

RESONATOR AND RESONATOR DEVICE

CROSS REFERENCE TO RELATED APPLICATIONS

The present application is a continuation of PCT/JP2016/073912 filed Aug. 16, 2016, which claims priority to U.S. Provisional Patent Application No. 62/240,574, filed Oct. 13, 2015, the entire contents of each of which are incorporated herein by reference.

TECHNICAL FIELD

The present disclosure relates to a resonator and a resonator device in which a plurality of vibrating arms vibrate in an out-plane bending vibration mode.

BACKGROUND

Currently, resonator devices using a MEMS (Micro Electro Mechanical Systems) technology are used as timing devices, for example. These resonator device are typically mounted on a printed circuit board built in an electronic apparatus such as a smartphone. Such a resonator device includes a lower substrate, an upper substrate that forms a cavity between the upper substrate and the lower substrate, and a resonator arranged in the cavity between the lower substrate and the upper substrate.

For example, Patent Document 1 (identified below) discloses a resonator including a plurality of vibrating arms. In this resonator, fixed ends of the vibrating arms are connected to a front end of a base portion. A rear end opposite to the front end of the base portion is connected to a support portion. The support portion is connected to, for example, a base that is interposed between a lower substrate and an upper substrate. In the example design in FIG. 1 of Patent Document 1, electric fields that are applied to the vibrating arms are mutually oppositely set, and hence vibration in opposite phases is provided between the vibrating arms at the inner side and the two vibrating arms at the outer side.

Patent Document 1: Japanese Patent No. 5071058.

During the vibration in the opposite phases, as illustrated in FIG. 1(c) of Patent Document 1, a torsion moment is generated at each vibrating arm in a direction around the central axis extending in parallel to the Y axis. Due to this torsion moment, bending vibration is generated around a rotation axis determined in parallel to the central axis, between the central axes of the adjacent vibrating arms that vibrate in opposite phases at the base portion of the resonator. The vibration is transmitted from the base portion through the support portion to the base. Since the base is held between the lower substrate and the upper substrate, the base attenuates the vibration by a certain degree. The inventors found that, when the amplitude of the vibration of the vibrating arms is large, the attenuation of this vibration distorts resonant waveform, and shifts resonant frequency. The shift of the resonant frequency significantly affects resonance characteristics and phase noise, and therefore improvement is desired.

SUMMARY OF THE INVENTION

Accordingly, the exemplary embodiments of the present disclosure have been made in light of such situations, and it is an object of the exemplary embodiments to restrict a shift of resonant frequency in a resonator.

Thus, according to an exemplary aspect, a resonator includes a vibrating part including a base, and a plurality of vibrating arms having first (i.e., fixed) ends connected to the base; a holding part provided in at least a portion of a periphery of the vibrating part; and a holding arm provided between the vibrating part and the holding part. Moreover, the base has a front end connected to the plurality of vibrating arms and a rear end opposite to the front end with the holding arm having a first end connected to the rear end and a second end connected to the holding part (e.g., a frame). The holding arm includes a pair of first support arms having first ends connected to the base at the rear end of the base, and a coupling portion that couples the pair of first support arms with one another and that is connected to the holding part.

With the exemplary resonator, when the base has a region (i.e., front end) connected to the vibrating arms and a region (i.e. rear end) opposite to the region (i.e., the front end), the vibrating part is connected to a pair of holding arms extended from the region (rear end). The pair of holding arms are coupled to one another into a single arm, and then the single arm is connected to the holding part. Accordingly, the holding arms can hold the base without disturbing a bending displacement of the base, and hence an increase in frequency during large-amplitude driving can be reduced. Consequently, a shift of resonant frequency can be restricted.

Preferably, the pair of first support arms are provided in a first direction in which the plurality of vibrating arms extend; and the coupling portion includes a first coupling arm provided in a second direction substantially orthogonal to the first direction and having one end connected to the other end of one of the pair of first support arms and the other end connected to the other end of the other of the pair of first support arms. Moreover, the coupling portion includes a second support arm provided in the first direction and having one end connected to a portion near the center of the first coupling arm and the other end connected to a region of the holding part facing the rear end of the base.

Preferably, the pair of first support arms are provided in a first direction in which the plurality of vibrating arms extend; and the coupling portion includes a first coupling arm provided in a second direction substantially orthogonal to the first direction and having one end connected to the other end of one of the pair of first support arms and the other end connected to the other end of the other of the pair of first support arms. In addition, the coupling portion includes a second coupling arm provided in the second direction at a position between the first coupling arm and the holding part, a second support arm provided in the first direction and having one end connected to a portion near the center of the first coupling arm and the other end connected to a portion near the center of the second coupling arm, and a pair of third support arms provided in the first direction and each having one end connected to either one of end portions of the second coupling arm and the other end connected to a region of the holding part facing the other ends of the plurality of vibrating arms.

Preferably, the pair of first support arms are provided in a first direction in which the plurality of vibrating arms extend. Moreover, the coupling portion includes a first coupling arm provided in a second direction substantially orthogonal to the first direction and having one end connected to the other end of one of the pair of first support arms and the other end connected to the other end of the other of the pair of first support arms, a second coupling arm provided in the second direction at a position between the first coupling arm and the holding part, a second support arm provided in the first direction and having one end connected to a portion near the center of the first coupling arm and the other end connected to a portion near the center of the second coupling arm, a pair of third support arms provided in the first direction and each having one end connected to either one of end portions of the second coupling arm, a fourth support arm provided in the second direction and having one end connected to one of the pair of third support arms and the other end connected to a region of the holding part facing the one of the pair of third support arms, and a fifth support arm provided in the second direction and having one end connected to the other of the pair of third support arms and the other end connected to a region of the holding part facing the other of the pair of third support arms.

With the resonator, the vibrating part is connected to the pair of holding arms extended from a side of the base opposite to a side of the base connected to the vibrating arm. The pair of holding arms are coupled to one another into a single arm at the center of the base, and then the single arm is connected to the holding part. Accordingly, the holding arm can hold the base without disturbing a bending displacement of the base, and hence an increase in frequency during large-amplitude driving can be reduced. Consequently, a variation in resonant frequency can be restricted. Also, the holding arm has bending points. Accordingly, the rotation moment is dispersed in the holding arm, concentration of distortion due to the rotation moment at the base can be reduced, and a variation in frequency can be restricted.

Preferably, the pair of first support arms are connected to the base in an area of the base where a displacement of the vibrating arms due to vibration is the smallest at the rear end opposite via the base to the front end connected to the vibrating arms. Preferably, the pair of first support arms are connected to the base at an inner side with respect to the center in the second direction between outermost vibrating arms of the plurality of vibrating arms. Preferably, the pair of first support arms each are connected to the base at a position between the plurality of vibrating arms.

According to the preferable aspect, the holding arm is connected to the vibrating part in a portion where a displacement due to vibration is small at the rear end opposite to the front end via the base. Accordingly, a leak of vibration is restricted, and the Q value can be further increased.

A resonator device according to an aspect of the present disclosure includes any of the above-described resonators.

With the resonator device, an increase in frequency during large-amplitude driving can be reduced. Consequently, a shift of resonant frequency can be restricted.

According to the exemplary embodiments of the present disclosure, a shift of resonant frequency can be restricted in the resonator.

DETAILED DESCRIPTION OF EXEMPLARY EMBODIMENTS

First Embodiment

Figure 1:
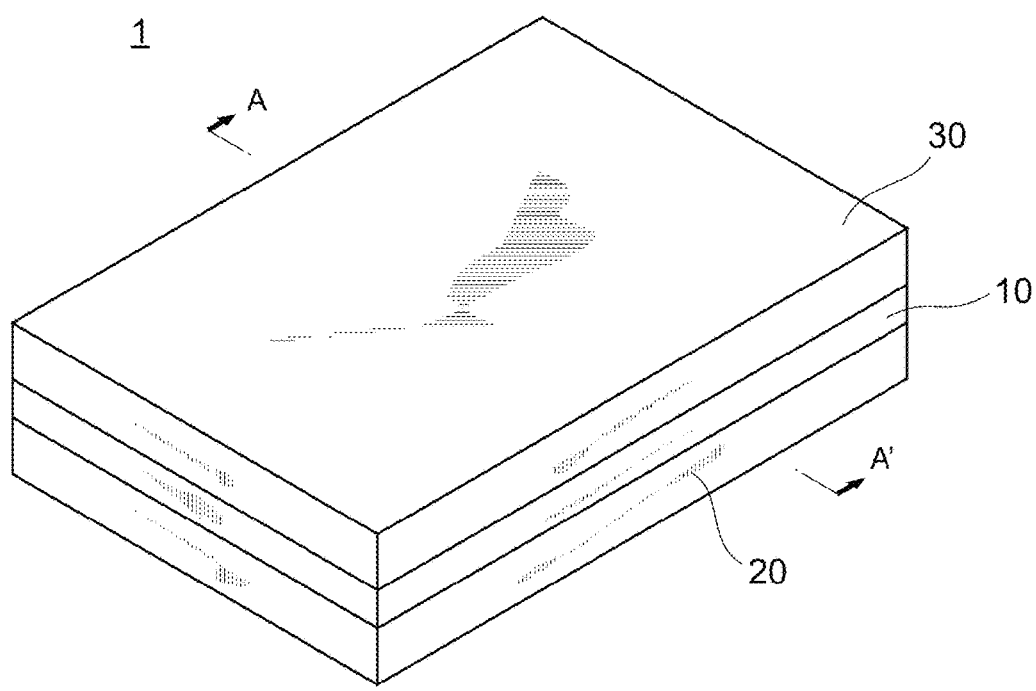
FIG. 1 is a perspective view schematically illustrating the external appearance of a resonator device according to a first exemplary embodiment.
Figure 2:
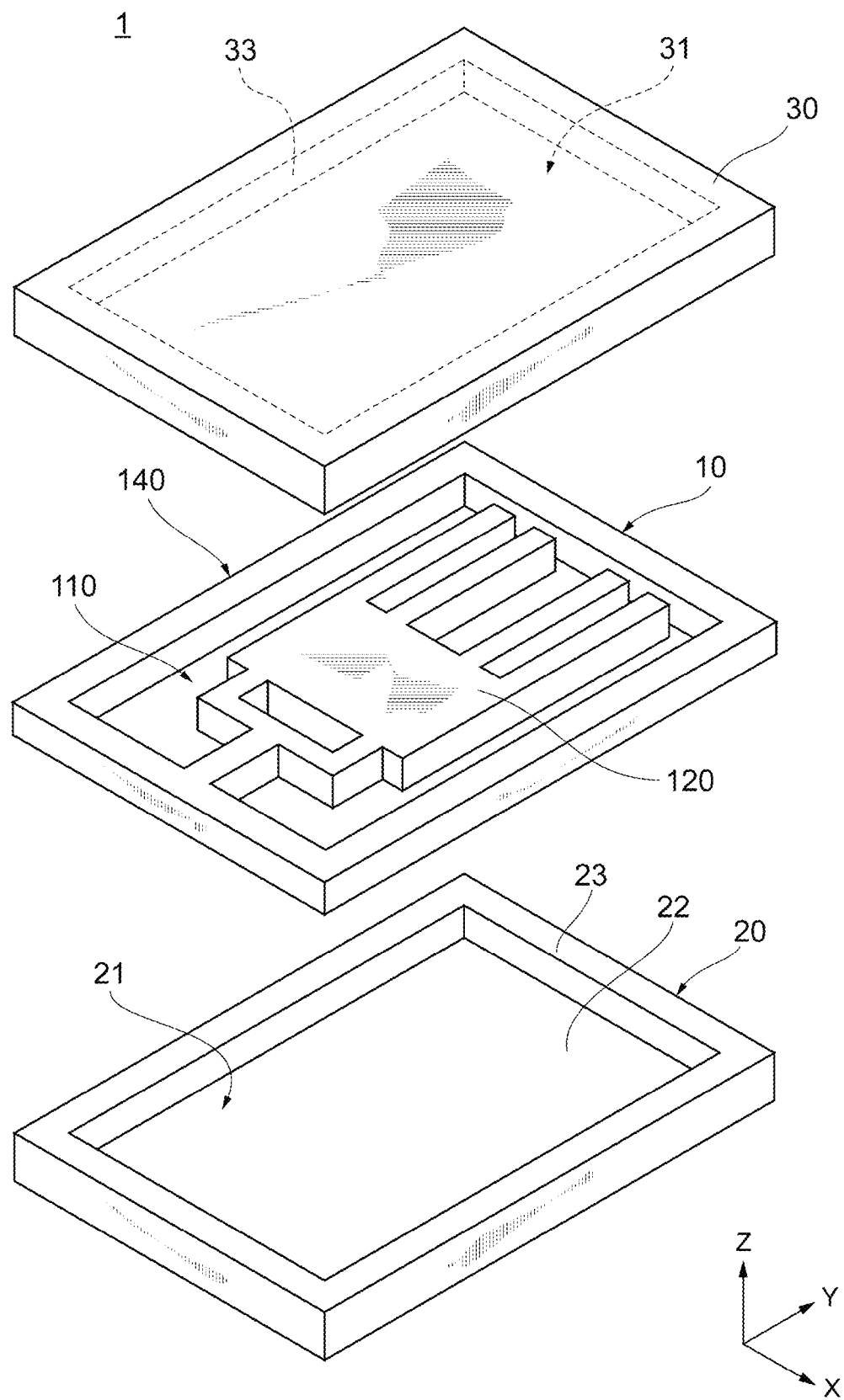
FIG. 2 is an exploded perspective view schematically illustrating the structure of the resonator device according to the first exemplary embodiment.

A first exemplary embodiment is described below with reference to the accompanying drawings. FIG. 1 is a perspective view schematically illustrating the external appearance of a resonator device 1 according to the first exemplary embodiment. Also, FIG. 2 is an exploded perspective view schematically illustrating the structure of the resonator device 1 according to the first exemplary embodiment.

As shown, the resonator device 1 includes a resonator 10, and an upper lid 30 and a lower lid 20 provided with the resonator 10 interposed therebetween. That is, the resonator device 1 is configured such that the lower lid 20, the resonator 10, and the upper lid 30 are stacked in that order.

Also, the resonator 10 is joined to the lower lid 20 and the upper lid 30. Hence, the resonator 10 is sealed and a vibration space of the resonator 10 is formed. The resonator 10, the lower lid 20, and the upper lid 30 each are formed by using a Si substrate. The Si substrates of the resonator 10, the lower lid 20, and the upper lid 30 are joined to one another and hence the resonator 10, the lower lid 20, and the upper lid 30 are joined to one another. The resonator 10 and the lower lid 20 may be formed by using SOI substrates, for example.

According to an exemplary aspect, the resonator 10 is a MEMS resonator manufactured by using a MEMS technology. Alternatively, the resonator 10 may be a crystal resonator.

Components of the resonator device 1 are described below in detail.

(1. Upper Lid 30)

The upper lid 30 extends in a flat-plate shape along the XY plane. A recess 31 having, for example, a flat rectangular-parallelepiped shape is formed in a back surface of the upper lid 30. The recess 31 is surrounded by a side wall 33, and forms a portion of the vibration space that is a space where the resonator 10 vibrates.

(2. Lower Lid 20)

The lower lid 20 includes a bottom plate 22 having a rectangular flat-plate shape provided along the XY plane, and a side wall 23 extending from a peripheral edge portion of the bottom plate 22 in the Z-axis direction (that is, stacking direction of the lower lid 20 and the resonator 10). A recess 21 formed of a front surface of the bottom plate 22 and an inner surface of the side wall 23 is provided in a surface of the lower lid 20 facing the resonator 10. The recess 21 forms a portion of the vibration space of the resonator 10. Moreover, the vibration space is hermetically sealed by the above-described upper lid 30 and lower lid 20, and is maintained in a vacuum. The vibration space may be filled with a gas, for example, inert gas.

(3. Resonator 10)

Figure 3:
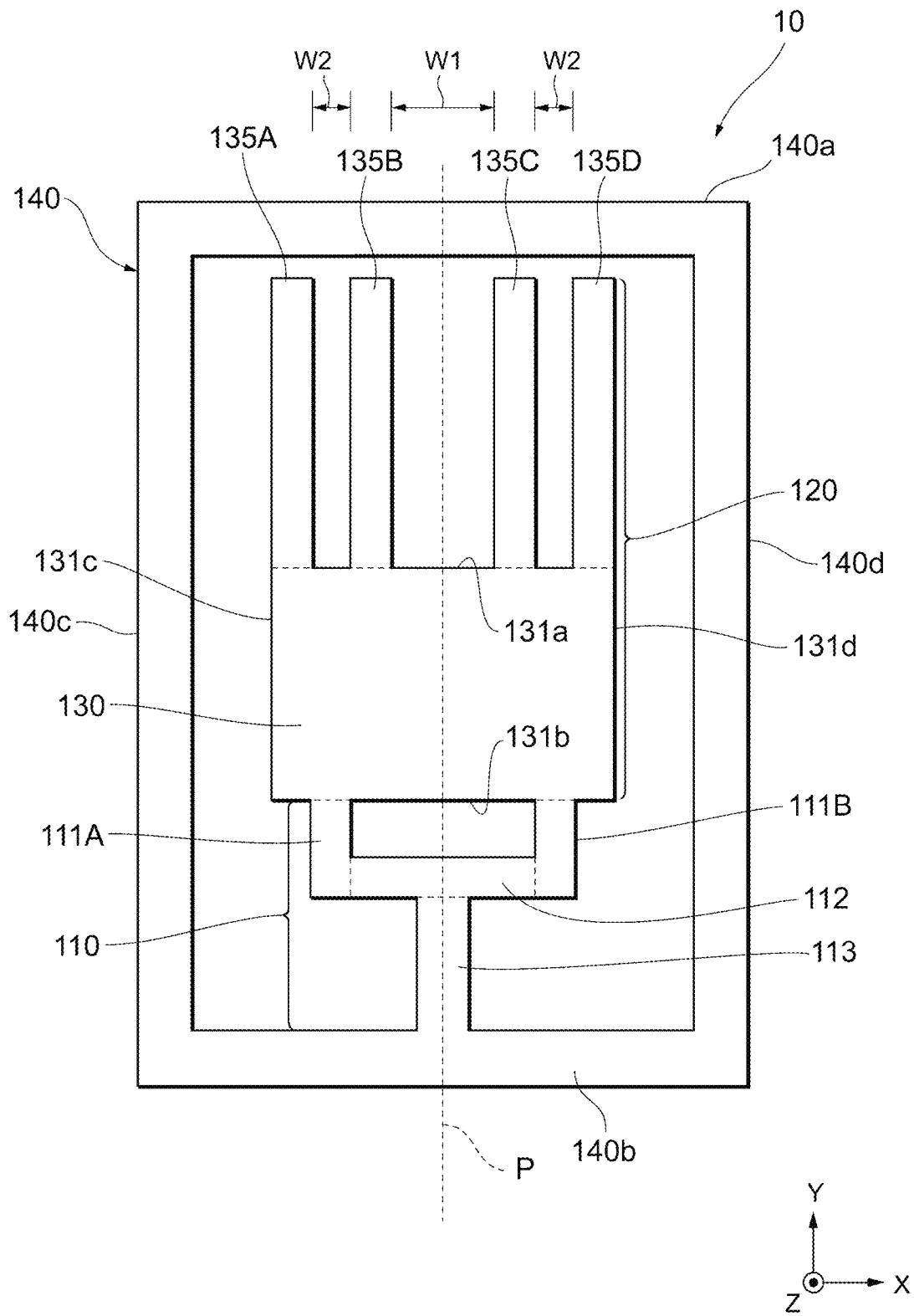
FIG. 3 is a plan view of a resonator according to the first exemplary embodiment from which an upper substrate is removed.

FIG. 3 is a plan view schematically illustrating the structure of the resonator 10 according to the exemplary embodiment. Components of the resonator 10 according to this embodiment are described with reference to FIG. 3. The resonator 10 includes a vibrating part 120 (i.e., a vibrating portion), a holding part or frame 140, and a holding arm 110 that supports the vibrating part 120.

(a) Vibrating Part 120

As shown, the vibrating part 120 (also referred to as a "vibration member" or "vibrator") has a plate-shaped contour extending in a flat-plate shape along the XY plane according to the orthogonal coordinate system in FIG. 3. The vibrating part 120 is provided at the inner side of the holding part 140 with a space formed between the vibrating part 120 and the holding part 140, by a predetermined distance. In the example in FIG. 3, the vibrating part 120 has a base 130 and four vibrating arms 135A to 135D. The number of vibrating arms is not limited to four, and may be set at, for example, a desirable number three or more.

The base 130 is a substantially rectangular-parallelepiped plate having long sides 131a and 131b extending in the X-axis direction and short sides 131c and 131d extending in the Y-axis direction. In the example in FIG. 3, the base 130 is connected to the holding part 140 by the holding arm 110 (described later) at the long side 131b (an example of a rear end), and is held by the holding part 140. In this embodiment, for example, the length of each of the long sides 131a and 131b is set at about 260 µm, and the length of each of the short sides 131c and 131d is set at about 50 µm. It is noted that the shape of the base 130 is not limited to the substantially rectangular-parallelepiped shape, and may be a desirable shape as long as the shape is symmetric with respect to a plane that is defined along the perpendicular bisector of the long side 131a. For example, the base 130 may have a trapezoidal shape in which the long side 131b is shorter than the long side 131a, or a semicircular shape having the long side 131a as the diameter thereof. Also, the long sides 131a and 131b, and the short sides 131c and 131d are not limited to straight lines, and may be curved lines.

As further shown, the vibrating arms 135A to 135D are provided between the base 130 and the holding part 140 and disposed in parallel to the Y-axis direction. First ends of the vibrating arms 135A to 135D are connected to the one long side 131a (an example of a front end) of the base 130 and serve as fixed ends, and the other ends thereof (i.e., opposite to the fixed ends) are free ends. In this embodiment, the vibrating arms 135A to 135D are integrally formed with the base 130. Also, the vibrating arms 135A to 135D are formed in rectangular-column shapes extending in the Y-axis direction (an example of a first direction), and have the same size. The vibrating arms 135A to 135D each have, for example, a width in the X-axis direction of about 50 µm, and a length in the Y-axis direction of about 643 µm.

As illustrated in FIG. 3, in the vibrating part 120 according to this embodiment, the two vibrating arms 135A and 135D are arranged at the outer side, and the two vibrating arms 135B and 135C are arranged at the inner side in the X-axis direction. A distance W1 between the vibrating arms 135B and 135C in the X-axis direction is set to be larger than a distance W2 between the vibrating arm 135A (135D) at the outer side and the vibrating arm 135B (135C) at the inner side adjacent to the vibrating arm 135A (135D) at the outer side. The distance W1 is, for example, about 25 µm, and the distance W2 is, for example, about 20 µm. The vibration characteristics are improved by setting the distance W2 to be smaller than the distance W1. Also, to downsize the resonator device 1, the distance W1 may be set to be smaller than the distance W2, or the distance W1 may be equivalent to the distance W2.

(b) Holding Part 140

The holding part 140 (which can be considered the frame of the resonator 10) is formed in, for example, a rectangular frame shape along the XY plane. The holding part 140 is provided to surround the outer side portion of the vibrating part 120 along the XY plane. The shape of the holding part 140 is not limited to the rectangular frame shape as long as the holding part 140 is provided in at least a portion of a periphery of the vibrating part 120. For example, the holding part 140 may be provided in the periphery of the vibrating part 120 in such a manner that the holding part 140 can hold the vibrating part 120 and can join the upper lid 30 and the lower lid 20 to one another.

Moreover, the holding part 140 includes frame bodies 140a to 140d having rectangular-column shapes. The frame bodies 140a to 140d are integrally formed and are shown as forming four sides of the frame 140 in the exemplary aspect.

The frame body 140a faces free ends of the vibrating arms 135A to 135D. The long-side direction of the frame body 140a is parallel to the X axis. The frame body 140b faces the long side 131b of the base 130. The long-side direction of the frame body 140b is parallel to the X axis. The frame body 140c faces a long side of the vibrating arm 135A. The long-side direction of the frame body 140c is parallel to the Y axis. Both ends of the frame body 140c are respectively connected to one ends of the frame bodies 140a and 140b. The frame body 140d faces a long side of the vibrating arm 135D. The long-side direction of the frame body 140d is parallel to the Y axis. Both ends of the frame body 140d are respectively connected to the other ends of the frame bodies 140a and 140b.

In the following description, the frame body 140a side is defined as the upper side of the resonator 10, and the frame body 140b side is defined as the lower side of the resonator 10.

(c) Holding Arm 110

The holding arm 110, which can be considered a "holding member" or "vibration member support", is provided at the inner side of the holding part 140. The holding arm 110 connects the long side 131b of the base 130 with the frame body 140a. As illustrated in FIG. 3, the holding arm 110 is substantially symmetric with respect to an imaginary plane P that is defined in parallel to the YZ plane along the center line in the X-axis direction of the base 130.

The holding arm 110 has a pair arms 111A and 111B (referred to as a pair of first support arms, for example), an arm 112 (referred to as a first coupling arm, for example), and an arm 113 (referred to as a second support arm, for example).

As shown, the pair of support arms 111A and 111B are disposed between the base 130 and the frame body 140b. The arms 111A and 111B face the frame body 140c and the frame body 140d, respectively. The long-side direction of the arms 111A and 111B is parallel to the Y axis. First ends of the arms 111A and 111B are connected to the base 130 at the long side 131b of the base 130. The arms 111A and 111B extend from the connection portions substantially perpendicularly to the long side 131b, that is, in the Y-axis direction. The axis of the arm 111A passing through the center in the X-axis direction is preferably provided at the inner side with respect to the center line of the vibrating arm 135A. In the example in FIG. 3, the arm 111A is provided between the center line of the vibrating arm 135A and the center line of the vibrating arm 135B. Also, the axis of the arm 111B passing through the center in the X-axis direction is preferably provided at the inner side with respect to the center line of the vibrating arm 135D. In the example in FIG. 3, the arm 111B is provided between the center line of the vibrating arm 135C and the center line of the vibrating arm 135D.

The other end (i.e., the second end) of the arm 111A is connected to one end of the arm 112 at a side surface (surface in the YZ plane) of the other end of the arm 111A. Also, the other end (i.e., the second end) of the arm 111B is connected to the other end of the arm 112 at a side surface (surface in the YZ plane) of the other end of the arm 111B. In the exemplary aspect, the arms 111A and 111B each have a width defined in the X-axis direction of about 20 μm, and a length defined in the Y-axis direction of about 40 μm.

The arm 112 is disposed between the base 130 and the frame body 140b. The arm 112 faces the frame body 140b. The long-side direction of the arm 112 is parallel to the X axis (an example of a second direction). A first end of the arm 112 is connected to the side surface of the second end of the arm 111A at a side facing the frame body 140d. The arm 112 extends from the connection portion substantially perpendicularly to the arm 111A, that is, in the X-axis direction. Also, the other second end of the arm 112 is connected to the side surface of the second end of the arm 111B at a side facing the frame body 140c. The arm 112 has, for example, a width defined in the Y-axis direction of about 20 μm, and a length defined in the X-axis direction of about 120 μm in an exemplary aspect.

The arm 113 is provided between the base 130 and the frame body 140b. Sides of the arm 113 faces the frame bodies 140c and 140d. The long-side direction of the arm 113 is parallel to the Y axis.

A first end of the arm 113 is connected to a portion near the center in the long-side direction (X-axis direction) of the arm 112. The arm 113 extends from the connection portion substantially perpendicularly to the arm 112, that is, in the Y-axis direction. Also, the other second end of the arm 113 is connected to a portion near the center in the X-axis direction of the frame body 140b.

The arm 113 has, for example, a width defined in the X-axis direction of about 30 μm, and a length defined in the Y-axis direction of about 70 μm in an exemplary aspect.

As described above, the holding arm 110 according to this embodiment is connected to the base 130 at the first ends of the arms 111A and 111B, is bent at the connection portions of the other second ends of the arms 111A and 111B with respect to the arm 112, is bent at the connection portion of the arm 112 with respect to the arm 113, and then is connected to the holding part 140. In other words, the two arms 111A and 111B of the holding arm 110 are joined into the single arm by the arm 112, and the joined single arm is connected to the holding part 140 by the single arm 113. Accordingly, regarding the holding arm 110 according to this embodiment, the plurality of arms connected to the long side 131b of the base 130 are joined into the single arm, and the single arm is connected to the holding part 140. Accordingly, the holding arm 110 can hold the base 130 without disturbing a bending displacement of the base 130. As a result, an increase in frequency during large-amplitude driving can be reduced. Consequently, the resonator 10 according to this embodiment can restrict a shift of resonant frequency.

It is noted that the shape of the holding arm 110 is not limited to the shape bent at the connection portions of the respective arms. The connection portions of the respective arms of the holding arm 110 may have curved shapes. Alternatively, the holding arm 110 may not have the arm 112, the arm 113 may couple the arm 111A with the arm 111B, and the arm 113 may be connected to the holding part 140. In this case, the arms 111A and 111B may be provided to come close to one another from the connection portions with respect to the base 130 toward the perpendicular bisector of the long side 131a. Also in this case, for example, when the arms 111A and 111B are coupled by the arm 113, the resultant may have a V-like shape or a U-like shape.

Also, since the holding arm 110 that holds the base 130 is connected to the holding part 140 by using the single arm of the holding arm 110, the anchor loss due to the holding arm 110 can be reduced as compared with a case where the holding arm 110 is connected to the holding part 140 by using a plurality of arms. Also, since the holding arm 110 is not arranged between the vibrating part 120 and the frame bodies 140c and 140d, the resonator device 1 can be downsized.

(4. Stack Structure)

Figure 4:
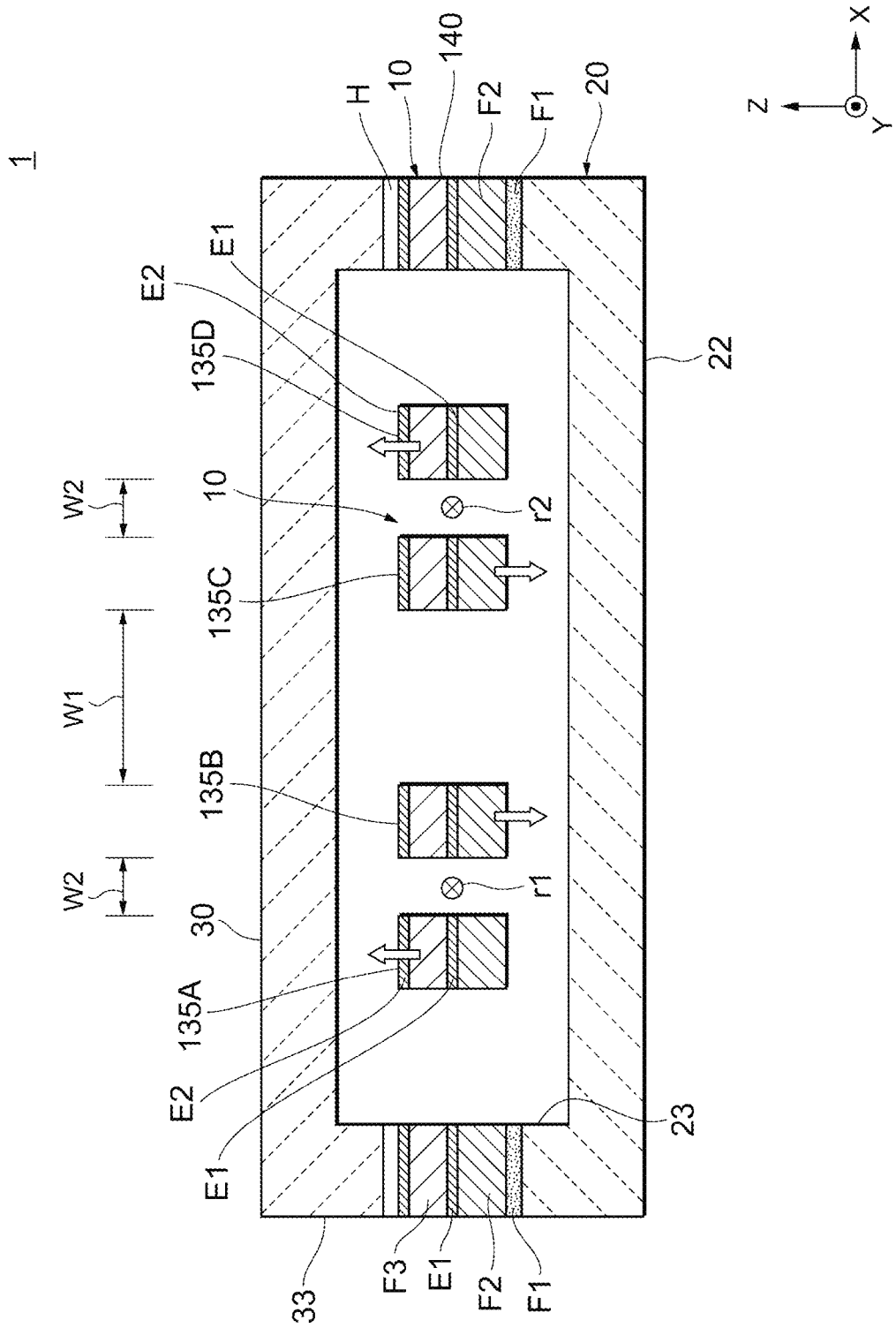
FIG. 4 is a cross-sectional view taken along line A-A' in FIG. 1.

The stack structure of the resonator device 1 is described with reference to FIG. 4. FIG. 4 is a cross-sectional view taken along line A-A' in FIG. 1.

As illustrated in FIG. 4, in the resonator device 1 according to this embodiment, the holding part 140 of the resonator 10 is joined onto the side wall 23 of the lower lid 20, and further the side wall 33 of the upper lid 30 is joined to the holding part 140 of the resonator 10. In this way, the resonator 10 is held between the lower lid 20 and the upper lid 30, and the vibration space in which the vibrating arms 135A to 135D vibrate is formed by the lower lid 20, the upper lid 30, and the holding part 140 of the resonator 10.

The bottom plate 22 and the side wall 23 of the lower lid 20 are integrally formed of Si (silicon). A silicon oxide (for example, $SiO_2$ (silicon dioxide)) film F1 is formed on an upper surface of the side wall 23, and the lower lid 20 is joined to the holding part 140 of the resonator 10 by the silicon oxide film F1. The thickness of the lower lid 20 defined in the Z-axis direction is, for example, 150 μm, and the depth of the recess 21 is, for example, 50 μm.

The upper lid 30 is formed of a Si (silicon) wafer having a predetermined thickness. As illustrated in FIG. 4, the upper lid 30 is joined to the holding part 140 of the resonator 10 at a peripheral portion (side wall 33) of the upper lid 30. A junction portion H is formed between a peripheral edge portion of the upper lid 30 and the holding part 140 to join the upper lid 30 with the holding part 140. The junction portion H is formed of, for example, an Au (gold) film and an Sn (tin) film.

In the resonator 10, the holding part 140, the base 130, the vibrating arms 135A to 135D, and the holding arm 110 are formed by the same process. In the resonator 10, first, a metal layer E1 is stacked on a Si (silicon) layer F2. Then, a piezoelectric thin film F3 is stacked on the metal layer E1 to cover the metal layer E1. A metal layer E2 is further stacked on the piezoelectric thin film F3.

The Si layer F2 is formed of, for example, a degenerate n-type Si semiconductor with a thickness of about and may contain P (phosphorus), As (arsenic), Sb (antimony), etc., as an n-type dopant. The resistance value of degenerate Si used for the Si layer F2 is preferably in a range from 0.5 mΩ·cm (inclusive) to 0.9 mΩ·cm (inclusive). A silicon oxide (for example, $SiO_2$) layer may be formed on a lower surface of the Si layer F2. Accordingly, temperature characteristics can be improved.

Also, the metal layers E2 and E1 each are formed by using, for example, Mo (molybdenum) or aluminum (Al) with a thickness of about 0.1 μm. If the degenerate Si is used as the Si layer F2, the Si layer F2 may also serve as the metal layer E2.

The metal layers E2 and E1 each are formed in a desirable shape by etching or another method. The metal layer E1 is formed on the vibrating part 120 to function as, for example, a lower electrode E1. Also, the metal layer E1 is formed on the holding arm 110 and the holding part 140 to function as wiring for connecting the lower electrode E1 with an alternating-current power supply provided outside the resonator 10.

On the other hand, the metal layer E2 is formed on the vibrating part 120 to function as an upper electrode E2. Also, the metal layer E2 is formed on the holding arm 110 and the holding part 140 to function as wiring for connecting the upper electrode E2 with an alternating-current power supply provided outside the resonator 10.

For connection from the alternating-current power supply to the lower wiring or upper wiring, a configuration in which an electrode is formed on an outer surface of the upper lid 30 and the electrode connects the alternating-current power supply with the lower wiring or upper wiring, or a configuration in which a via is formed in the upper lid 30, the inside of the via is filled with a conductive material to provide wiring, and the wiring connects the alternating-current power supply with the lower wiring or upper wiring may be used.

The piezoelectric thin film F3 is a thin film of a piezoelectric body that transforms an applied voltage into vibration. For example, the main component of the piezoelectric thin film F3 may be a nitride such as AlN (aluminum nitride), or an oxide. To be specific, the piezoelectric thin film F3 may be formed of ScAlN (scandium aluminum nitride). ScALN is obtained by replacing part of aluminum in aluminum nitride with scandium. Also, the piezoelectric thin film F3 has, for example, a thickness of 1 μm.

The piezoelectric thin film F3 expands and contracts in the in-plane direction of the XY plane, that is, the Y-axis direction in accordance with an electric field that is applied to the piezoelectric thin film F3 by the metal layers E2 and E1. By the expansion and contraction of the piezoelectric thin film F3, the free ends of the vibrating arms 135A to 135D are displaced toward the inner surfaces of the lower lid 20 and the upper lid 30, and the vibrating arms 135A to 135D vibrate in an out-plane bending vibration mode.

In this embodiment, as illustrated in FIG. 4, the phase of the electric field that is applied to the vibrating arms 135A and 135D at the outer side is set to be opposite to the phase of the electric field that is applied to the vibrating arms 135B and 135C at the inner side. Accordingly, the vibrating arms 135A and 135D at the outer side are displaced in a direction opposite to a direction in which the vibrating arms 135B and 135C at the inner side are displaced. For example, when the free ends of the vibrating arms 135A and 135D at the outer side are displaced toward the inner surface of the upper lid 30, the free ends of the vibrating arms 135B and 135C at the inner side are displaced toward the inner surface of the lower lid 20.

With the resonator device 1 as described above, during the vibration in the opposite phases, the vibrating arm 135A and the vibrating arm 135B vibrate in the vertically opposite directions around a central axis r1 arranged between the vibrating arm 135A and the vibrating arm 135B and extending in parallel to the Y axis illustrated in FIG. 4. Also, the vibrating arm 135C and the vibrating arm 135D vibrate in the vertically opposite directions around a central axis r2 arranged between the vibrating arm 135C and the vibrating arm 135D and extending in parallel to the Y axis. Accordingly, torsion moments in the opposite directions are generated at the central axes r1 and r2, and bending vibration is generated in the base 130.

Figure 5:
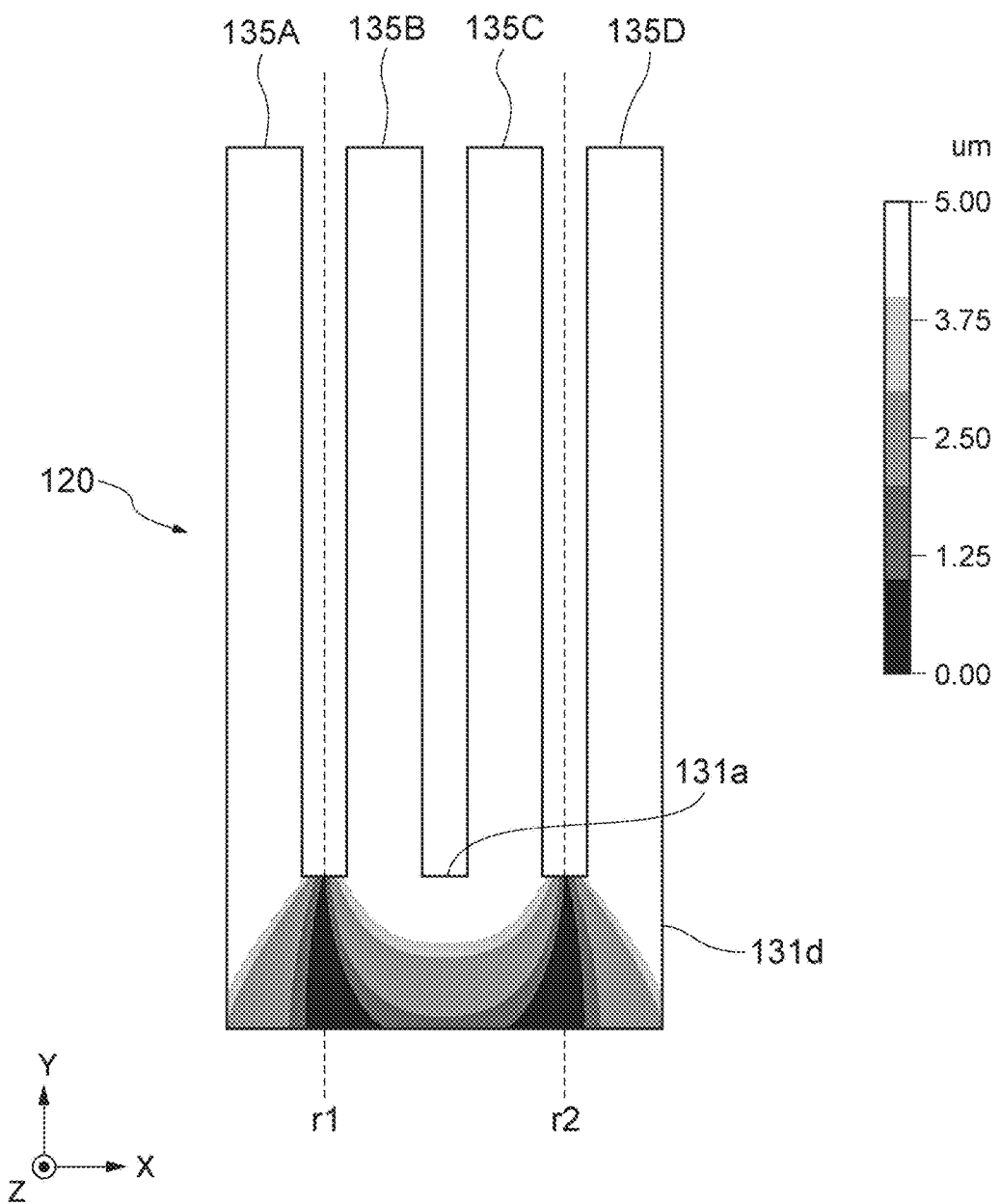
FIG. 5 illustrates a distribution of displacements of vibration of the resonator according to the first exemplary embodiment.

FIG. 5 schematically illustrates a distribution of displacements by the vibration of the vibrating part 120 according to this embodiment. In FIG. 5, a portion with a dark color represents a portion with a small displacement as compared with a portion with a light color. As illustrated in FIG. 5, the central axes r1 and r2 pass through the centers of portions with smaller displacements as compared with the other portions.

The moments generated at the central axes r1 and r2 propagate to the entire base 130 from a portion between the vibrating arms 135A and 135B of the base 130 and a portion between the vibrating arms 135C and 135D of the base 130 (portions with dark colors in FIG. 5). In the resonator device 1 according to this embodiment, the base 130 is not directly fixed to the holding part 140, and is connected to the holding part 140 via the holding arm 110. Accordingly, the moments in the rotation directions can be dispersed at the holding arm 110, and a variation in vibration frequency of the resonator 10 can be reduced. Further, this effect can be increased by bending the holding arm 110.

Also, in the resonator device 1 according to this embodiment, since the base 130 and the holding arm 110 are connected at the long side 131b opposite to the long side 131a connected to the vibrating arms 135A to 135D, a leak of vibration can be restricted, and the Q value is increased. Further, the connection point with respect to the holding arm 110 is provided in an area of the long side 131b where the displacement due to vibration is smaller or more preferably the smallest (i.e., displacement is preferably minimized) as compared with that of the other area. Hence, the vibration characteristics can be further improved. To be specific, the holding arm 110 is desirably connected to the long side 131b in such a manner that the axis passing through the center in the X-axis direction of the arm 111A and 111B is aligned with the central axes r1 and r2.

Second Embodiment

In a second exemplary embodiment or later, the description on the matter common to that of the first embodiment described above is omitted, and only different points are described. In particular, like advantageous effects obtained by like configurations are not repeatedly described for each embodiment.

Figure 6:
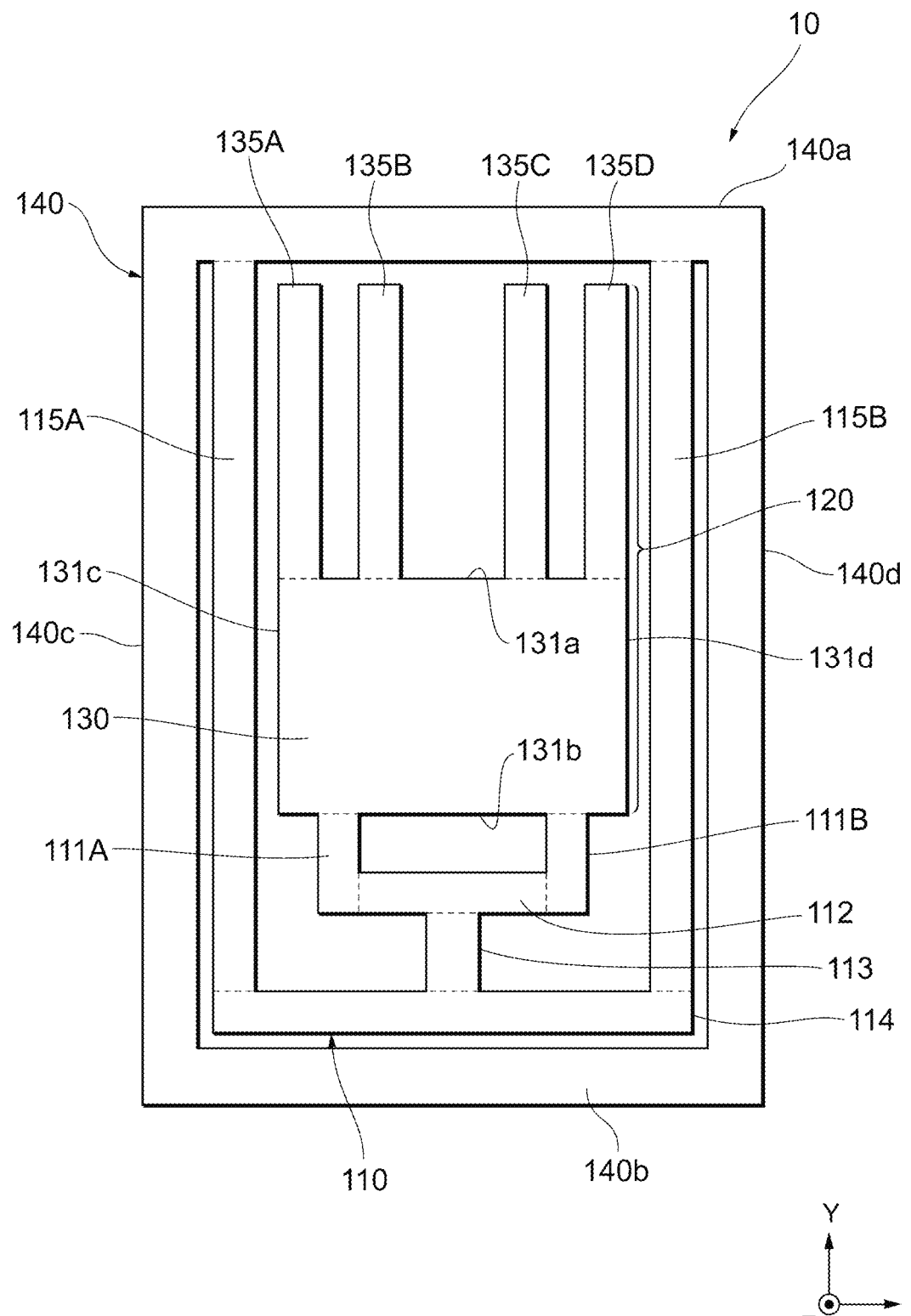
FIG. 6 is a plan view of a resonator according to a second exemplary embodiment from which an upper substrate is removed, FIG. 6 corresponding to FIG. 3.

FIG. 6 illustrates an example of a plan view of a resonator 10 according to this exemplary embodiment. Hereinafter, points different from the first embodiment are mainly described from among specific components of a resonator device 1 according to this embodiment.

In this embodiment, the vibrating part 120 is connected to the holding part 140 at the frame body 140a by the holding arm 110 connected to the long side 131b of the base 130.

In this embodiment, the holding arm 110 includes an arm 114 (an example of a second coupling arm), and arms 115A and 115B (an example of a pair of third support arm), in addition to the arms 111A, 111B, 112, and 113.

Also, the other end of the arm 113 is connected to a portion near the center in the X-axis direction of the arm 114. In this embodiment, the arm 113 has, for example, a width defined in the X-axis direction of about 30 μm, and a length defined in the Y-axis direction of about 40 μm.

As shown, the arm 114 is provided between the arm 112 and the frame body 140b. The arm 114 faces the frame body 140b. The long-side direction of the arm 114 is parallel to the X-axis direction. One end of the arm 114 is connected to the arm 115A at a side surface thereof. The other end of the arm 114 is connected to the arm 115B at a side surface thereof. The arm 114 has, for example, a length defined in the X-axis direction of about 350 μm, and a width defined in the Y-axis direction of about 20 μm.

The arm 115A is provided between the vibrating arm 135A and the frame body 140c. The long-side direction of the arm 115A is parallel to the Y axis. One end of the arm 115A is connected to the one end of the arm 114, that is, a side surface of the arm 114 at a side facing the long side 131b of the base 130. The arm 115A extends from the connection portion substantially perpendicularly to the arm 114, that is, in the Y-axis direction. Also, the other end of the arm 115A is connected to a portion of the frame body 140a at the outer side with respect to a position facing the vibrating part 120.

In an exemplary aspect, the arm 115A has, for example, a width defined in the X-axis direction of about 20 μm, and a length defined in the Y-axis direction of about 780 μm.

It should be appreciated that the configuration of the arm 115B is similar to that of the arm 115A.

The other arms of the holding arm 110 are similar to those of the first embodiment.

Moreover, as described above, since the holding arm 110 according to this embodiment does not connect the long side 131b of the base 130 with the frame body 140b, the space between the long side 131b and the frame body 140b can be narrowed. Consequently, the resonator device 1 can be downsized. Also, since the holding arm 110 is bent plural times (four times) and is connected to the holding part 140, an increase in frequency during large-amplitude driving can be further reduced. Consequently, the effect of restricting a variation in resonant frequency can be further increased.

The other configuration and effect are similar to those of the first embodiment.

Third Embodiment

In a third exemplary embodiment or later, the description on the matter common to that of the first embodiment described above is omitted, and only different points are described. In particular, like advantageous effects obtained by like configurations are not repeatedly described for each embodiment.

Figure 7:
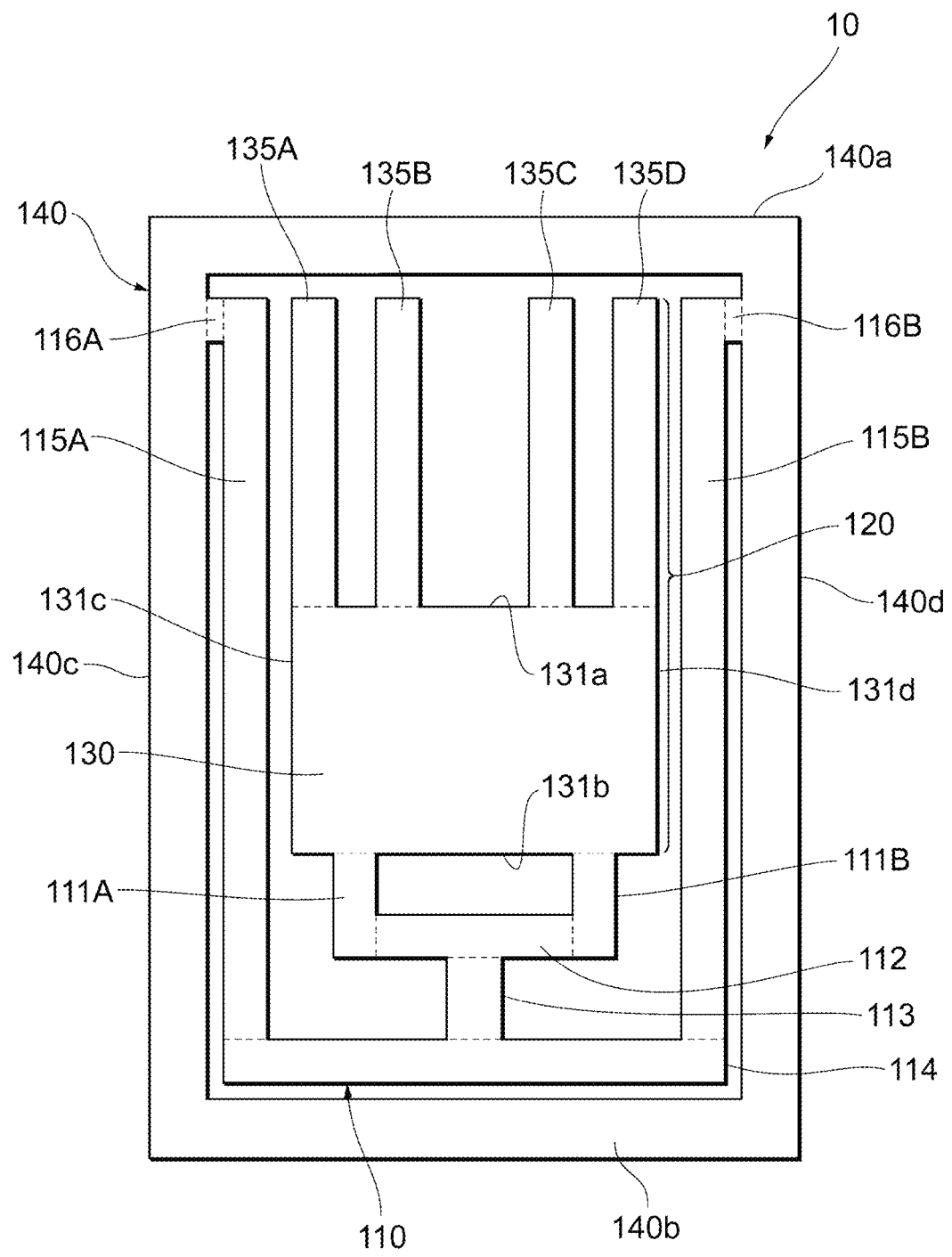
FIG. 7 is a plan view of a resonator according to a third exemplary embodiment from which an upper substrate is removed, FIG. 7 corresponding to FIG. 3.

FIG. 7 illustrates an example of a plan view of a resonator 10 according to this exemplary embodiment. Hereinafter, points different from the first embodiment are mainly described from among specific components of a resonator device 1 according to this embodiment.

In this embodiment, the vibrating part 120 is connected to the holding part 140 at the frame bodies 140c and 140d by the holding arm 110 connected to the long side 131b of the base 130.

In this embodiment, the holding arm 110 includes arms 114, 115A, 115B, an arm 116A (an example of a fourth support arm), and an arm 116B (an example of a fifth support arm), in addition to the arms 111A, 111B, 112, and 113.

The configuration of the arms 113 and 114 are similar to those of the second embodiment described above.

The arm 115A is provided between the vibrating arm 135A and the frame body 140c. The long-side direction of the arm 115A is parallel to the Y axis. One end of the arm 115A is connected to one end of the arm 114, that is, a side surface of the arm 114 at a side facing the long side 131b of the base 130. The arm 115A extends from the connection portion substantially perpendicularly to the arm 114, that is, in the Y-axis direction. The other end of the arm 115A is connected to one end of the arm 116A at a side surface of the arm 115A at a side facing the frame body 140c.

The arm 115A has, for example, a width defined in the X-axis direction of about 20 μm, and a length defined in the Y-axis direction of about 750 μm according to an exemplary aspect.

The configuration of the arm 116B is similar to that of the arm 116A.

The arm 116A is provided between the vibrating arm 135A and the frame body 140c. The arm 116A faces the frame body 140a. The long-side direction of the arm 116A is parallel to the X axis. One end of the arm 116A is connected to the other end of the arm 115A, that is, a side surface of the arm 115A at a side facing the frame body 140c. The arm 116A extends from the connection portion substantially perpendicularly to the arm 115A, that is, in the X-axis direction. Also, the other end of the arm 116A is connected to the frame body 140c at a position facing an end portion of the free end of the vibrating arm 135A.

The arms 116A and 116B each have a width defined in the Y-axis direction of about 20 μm, and a length defined in the X-axis direction of about 10 μm according to an exemplary aspect.

Moreover, the configuration of the arm 115B is similar to that of the arm 115A.

The other arms of the holding arm 110 are similar to those of the first embodiment.

As described above, the one end of the holding arm 110 according to this embodiment is connected to the long side 131b of the base 130 by the two arms, and the two arms extend from the connection portions toward the frame body 140b. One of the two arms of the holding arm 110 is bent in a direction toward the frame body 140c (that is, the negative X-axis direction), the other of the two arms is bent in a direction toward the frame body 140d (that is, the positive X-axis direction), and the two arms are coupled to one another into the single arm. Further, the holding arm 110 is bent from the coupled portion in a direction toward the frame body 140c (that is, the negative X-axis direction) and in a direction toward the frame body 140d (that is, the positive X-axis direction), is bent in a direction toward the frame body 140a (that is, the Y-axis direction), and is bent again in the direction toward the frame body 140c or 140d again. Then the other end of the holding arm 110 is connected to the frame body 140c or 140d.

In this embodiment, the holding arm 110 is bent five times and then connected to the frame bodies 140c and 140d. Accordingly, an increase in frequency during large-amplitude driving in the vibrating part 120 can be reduced.

Consequently, the effect of restricting a variation in resonant frequency can be further increased.

The other configuration and effect are similar to those of the first embodiment.

Fourth Embodiment

Figure 8:
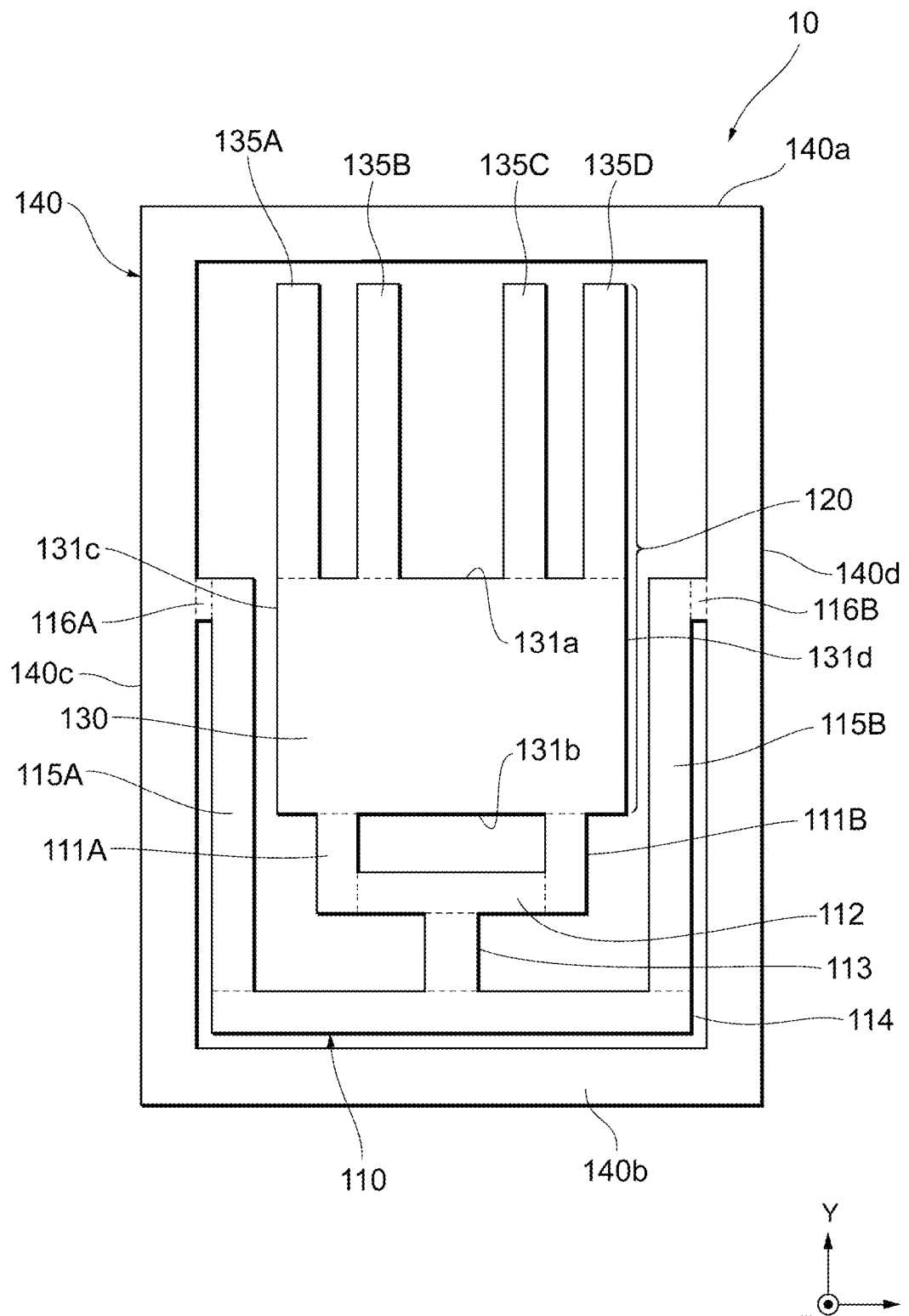
FIG. 8 is a plan view of a resonator according to a fourth exemplary embodiment from which an upper substrate is removed, FIG. 8 corresponding to FIG. 3.

FIG. 8 illustrates an example of a plan view of a resonator 10 according to this exemplary embodiment. Hereinafter, points different from the first embodiment are mainly described from among specific components of a resonator device 1 according to this embodiment.

In this embodiment, the vibrating part 120 is connected to the holding part 140 at the frame bodies 140c and 140d by the holding arm 110 connected to the long side 131b of the base 130.

In this embodiment, the holding arm 110 includes arms 114, 115A, 115B, 116A, and 116B, in addition to the arms 111A, 111B, 112, and 113.

The configuration of the arms 113 and 114 are similar to those of the second embodiment.

The configuration of the arms 115A and 115B are similar to those of the third embodiment. However, in this embodiment, the arms 115A and 115B each have, for example, a width defined in the X-axis direction of about 20 μm, and a length defined in the Y-axis direction of about 130 μm.

In this embodiment, the other end of the arm 116A is connected to a portion of the frame body 140c near a position facing the connection portion between the long side 131a of the base 130 and the vibrating arm 135A. The other configuration of the arm 116A is similar to that of the third embodiment.

The configuration of the arm 116B is similar to that of the arm 116A. Moreover, the other arms of the holding arm 110 are similar to those of the first embodiment.

As described above, the one end of the holding arm 110 according to this embodiment is connected to the long side 131b of the base 130 by the two arms, and the two arms extend from the connection portions toward the frame body 140b. One of the two arms of the holding arm 110 is bent in a direction toward the frame body 140c (that is, the negative X-axis direction), the other of the two arms is bent in a direction toward the frame body 140d (that is, the positive X-axis direction), and the two arms are coupled to one another into the single arm. Further, the holding arm 110 is bent from the coupled portion in a direction toward the frame body 140c (that is, the negative X-axis direction) and in a direction toward the frame body 140d (that is, the positive X-axis direction), is bent in a direction toward the frame body 140a (that is, the Y-axis direction), and is bent again in the direction toward the frame body 140c or 140d again. Then the other end of the holding arm 110 is connected to the frame body 140c or 140d.

In this embodiment, the holding arm 110 is bent two or more times and then connected to the frame bodies 140c and 140d like the resonator 10 according to the third embodiment. Accordingly, an increase in frequency during large-amplitude driving in the vibrating part 120 can be reduced. Consequently, the effect of restricting a variation in resonant frequency can be further increased.

Fifth Embodiment

Figure 9:
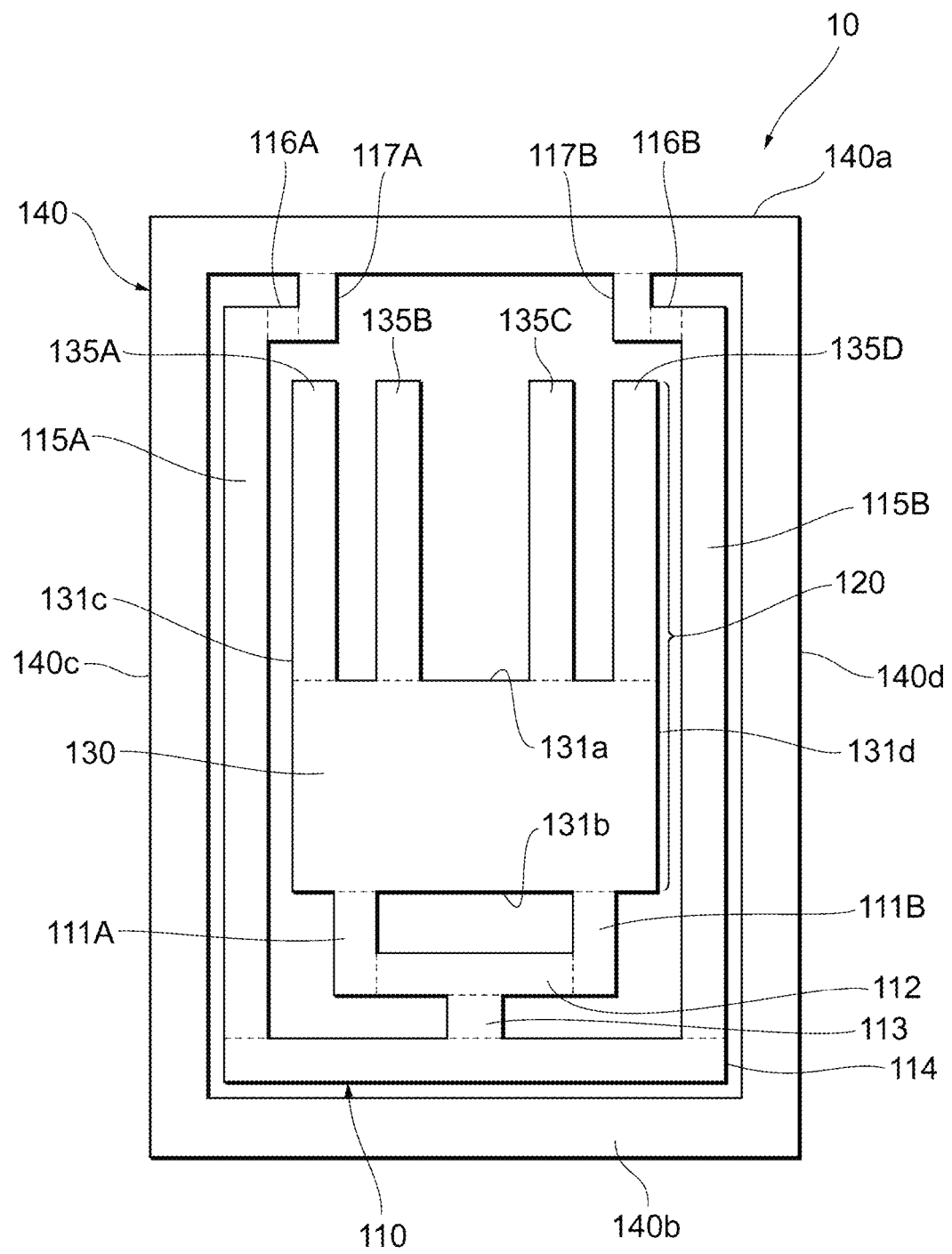
FIG. 9 is a plan view of a resonator according to a fifth exemplary embodiment from which an upper substrate is removed, FIG. 9 corresponding to FIG. 3.

FIG. 9 illustrates an example of a plan view of a resonator 10 according to this exemplary embodiment. Hereinafter, points different from the first embodiment are mainly described from among specific components of a resonator device 1 according to this embodiment.

In this embodiment, the holding arm 110 includes arms 114, 115A to 117A, and 115B to 117B, in addition to the arms 111A, 111B, 112, and 113.

The configurations of the arms 113 and 114 are similar to those of the second embodiment.

The other end of the arm 115A is connected to one end of the arm 116A at a side surface at a side facing the frame body 140d. The arm 115A has, for example, a width defined in the X-axis direction of about 20 μm, and a length defined in the Y-axis direction of about 800 μm. The other configuration of the arm 115A is similar to that of the third embodiment.

The configuration of the arm 115B is similar to that of the arm 115A.

The arm 116A is provided between the vibrating arm 135A and the frame body 140c. The arm 116A faces the frame body 140a. The long-side direction of the arm 116A is parallel to the X-axis direction. One end of the arm 116A is connected to the other end of the arm 115A, that is, a side surface of the arm 115A at a side facing the frame body 140d. The arm 116A extends from the connection portion substantially perpendicularly to the arm 115A, that is, in the X-axis direction. The other end of the arm 116A is connected to one end of the arm 117A, that is, a side surface at a side facing the frame body 140c.

The arm 116A has, for example, a width defined in the Y-axis direction of about 20 μm, and a length defined in the X-axis direction of about 10 μm according to an exemplary aspect.

The configuration of the arm 116B is similar to that of the arm 116A.

The arm 117A is provided between the vibrating arm 135A and the frame body 140a. The arm 117A faces the frame body 140c. The long-side direction of the arm 117A is parallel to the Y axis. One end of the arm 117A is connected to the other end of the arm 116A at a side surface thereof. Also, the other end of the arm 117A is connected to the frame body 140a at a position facing the vibrating arm 135A. The arm 117A extends from the connection portion substantially perpendicularly to the frame body 140a, that is, in the Y-axis direction.

The arm 117A has, for example, a width defined in the X-axis direction of about 20 μm, and a length defined in the Y-axis direction of about 40 μm according to an exemplary aspect.

The configuration of the arm 117B is similar to that of the arm 117A.

The other arms of the holding arm 110 are similar to those of the first embodiment.

As described above, the one end of the holding arm 110 according to this embodiment is connected to the long side 131b of the base 130 by the two arms, and the two arms extend from the connection portions toward the frame body 140b. One of the two arms of the holding arm 110 is bent in a direction toward the frame body 140c (that is, the negative X-axis direction), the other of the two arms is bent in a direction toward the frame body 140d (that is, the positive X-axis direction), and the two arms are coupled to one another into the single arm. Further, the holding arm 110 is bent from the coupled portion in a direction toward the frame body 140c (that is, the negative X-axis direction) and in a direction toward the frame body 140d (that is, the positive X-axis direction), is bent in a direction toward the frame body 140a (that is, the Y-axis direction), is bent again in the directions toward the frame body 140d or 140c again, and is further bent in a direction toward the frame body 140a. The other end of the holding arm 110 is connected to the frame body 140a.

According to this embodiment, by increasing the number of bent portions of the holding arm 110, the moment in the holding arm 110 can be further dispersed, and the effect of restricting a variation in resonant frequency can be further increased.

The other configuration and effect are similar to those of the first embodiment.

The above-described embodiments are provided for easier understanding of the present invention and are not for interpreting the present invention in a limited manner. The present invention may be modified or improved without departing from the idea, and the present invention includes the equivalents of the modified or improved configuration. That is, the present invention includes, within its scope, a configuration obtained by those skilled in the art properly adding a change in design to any of the aforementioned embodiments as long as the resultant has the characteristics of the present invention. For example, respective elements, their arrangement, materials, conditions, shapes, sizes, and so forth in any of the aforementioned embodiments are not limited to those exemplified, and may be properly changed. For example, while the holding arm 110 is bent a predetermined number of times in the above-described embodiments, the number of bent times is not limited thereto. For example, the holding arm 110 may be bent a number of times equal to or larger than the number of times described in any one of the aforementioned embodiments, and the long side 131b of the base 130 may be connected to the frame body 140b or may be connected to the frame bodies 140c and 140d. The embodiments are merely examples, and the respective elements included in different ones of the aforementioned embodiments may be combined as far as technically possible. The present invention includes the combination as long as the combination has the characteristics of the present invention.

REFERENCE SIGNS LIST 1 resonator device
10 resonator
30 upper lid
20 lower lid
140 holding part
140a-d frame body
110 holding arm
111-117 arm
120 vibrating part
130 base
131a, 131b long side
131c, 131d short side
135A-D vibrating arm

The invention claimed is:

1. A resonator comprising:
a vibrator that includes a base and a plurality of vibrating arms extending from a first side of the base;
a frame that at least partially surrounds the vibrator; and
a holding arm coupling the frame to a second side of the base opposite the first side, the holding arm including a pair of first support arms having first ends respectively connected to the second side of the base and a coupling portion that couples the pair of first support arms to each other and that is connected to the frame, wherein each of the base, the plurality of vibrating arms and the coupling portion of the holding arm are all disposed in a same plane as each other.

2. The resonator according to claim 1, wherein the pair of first support arms extend in a first direction that is parallel to a lengthwise direction of the plurality of vibrating arms.

3. The resonator according to claim 2, wherein the coupling portion includes:
a first coupling arm extending in a second direction orthogonal to the first direction and having a first end connected to a second end of a first of the pair of first support arms and a second end connected to a second end of a second of the pair of first support arms, and
a second support arm extending in the first direction and having a first end connected to a center of the first coupling arm and a second end connected to a region of the frame facing the second side of the base.

4. The resonator according to claim 2, wherein the coupling portion includes:
a first coupling arm extending in a second direction orthogonal to the first direction and having a first end connected to a second end of a first of the pair of first support arms and a second end connected to a second end of a second of the pair of first support arms,
a second coupling arm extending in the second direction at a position between the first coupling arm and the frame,
a second support arm extending in the first direction and having a first connected to a center of the first coupling arm and a second end connected to a center of the second coupling arm, and
a pair of third support arms extending in the first direction and each having a first end connected to respective ends of the second coupling arm and second ends connected to a region of the frame facing free ends of the plurality of vibrating arms.

5. The resonator according to claim 2, wherein the coupling portion includes:
a first coupling arm extending in a second direction orthogonal to the first direction and having a first end connected to a second end of a first of the pair of first support arms and a second end connected to a second end of a second of the pair of first support arms,
a second coupling arm extending in the second direction at a position between the first coupling arm and the frame,
a second support arm extending in the first direction and having a first end connected to a center of the first coupling arm and a second end connected to a center of the second coupling arm,
a pair of third support arms extending in the first direction and each having a first end connected to respective ends of the second coupling arm,
a fourth support arm extending in the second direction and having a first end connected to a first of the pair of third support arms and a second end connected to a region of the frame part facing the first of the pair of third support arms, and
a fifth support arm extending in the second direction and having a first end connected to a second of the pair of third support arms and a second end connected to a region of the frame facing the second of the pair of third support arms.

6. The resonator according to claim 1, wherein the pair of first support arms are connected to the base in an area of the base where a displacement of the plurality of vibrating arms due to vibration is minimized at a rear end of the base opposite to a front end of the base connected to the plurality of vibrating arms.

7. The resonator according to claim 1, wherein the pair of first support arms are connected to the base at an inner side with respect to a center in the second direction between outermost vibrating arms of the plurality of vibrating arms.

8. The resonator according to claim 1, wherein the pair of first support arms are each respectively connected to the base at positions between the plurality of vibrating arms.

9. The resonator according to claim 1, wherein the plurality of vibrating arms comprises a first pair of vibrating arms and a second pair of vibrating arm with respective first and second central axes extending in a lengthwise direction of the plurality of vibrating arms, the first and second central axes being between the first and second pairs of vibrating arms, respectively.

10. The resonator according to claim 9, wherein the pair of first support arms are respectively connected to positions of the second side of the base that intersect the first and second central axes, respectively, in the lengthwise direction, such that displacement due to vibration during excitation is minimized.

11. A resonator comprising:
a vibration member having a base and a plurality of vibrating arms extending from the base in a first direction;
a frame that at least partially surrounds the vibration member; and
a vibration member support coupling the frame to the base,
wherein the vibration member support includes:
a pair of first support arms extending from the base in the first direction and a connected to a side of the base opposite the plurality of vibrating arms; and
a coupling member that connects the pair of first support arms to the frame.

12. The resonator according to claim 11, wherein the coupling member includes a first coupling arm extending in a second direction orthogonal to the first direction and having a first end connected to one of the pair of first support arms and a second end connected to the other of the pair of first support arms.

13. The resonator according to claim 12, wherein the coupling member further includes a second support arm extending in the first direction and having a first end connected the first coupling arm and a second end connected to the frame.

14. The resonator according to claim 13, wherein the first end of the second support arm is connected to a center of the first coupling arm and the second end of the second support arm is connected to a region of the frame facing the side of the base opposite the plurality of vibrating arms.

15. The resonator according to claim 11, wherein the pair of first support arms are connected to the base in an area of the base where a displacement of the plurality of vibrating arms due to vibration is minimized at a rear end of the base opposite to a front end of the base connected to the plurality of vibrating arms.

16. The resonator according to claim 11, wherein the pair of first support arms are each respectively connected to the base at positions between the plurality of vibrating arms.

17. The resonator according to claim 11, wherein the plurality of vibrating arms comprises a first pair of vibrating arms and a second pair of vibrating arm with respective first and second central axes extending in a lengthwise direction of the plurality of vibrating arms, with the first and second central axes being between the first and second pairs of vibrating arms, respectively.

18. The resonator according to claim 17, wherein the pair of first support arms are respectively connected to the base at positions that intersect with the first and second central axes, respectively, in the lengthwise direction, such that displacement due to vibration during excitation is minimized.

19. A resonator comprising:
a vibrator having a base and a plurality of vibrating arms extending from the base;
a frame that at least partially surrounds the vibrator; and
a vibrator support coupling the frame to the base, wherein the vibrator support includes a pair of support arms connected to a side of the base opposite the plurality of vibrating arms and extending from the base in a lengthwise direction that is a same direction as the plurality of vibrating arms, with the pair of support arms coupled to the base at respective positions configured to minimize displacement of the plurality of vibrating arms due to vibration.

20. The resonator according to claim 19, wherein the vibrator support further includes a coupling member that connects the pair of support arms to the frame.

21. The resonator according to claim 1, wherein the coupling portion couples the pair of first support arms to each other to define an opening between the second side of the base, the pair of support arms and the coupling portion.

* * * * *